(12) United States Patent
Kong et al.

(10) Patent No.: US 12,495,554 B2
(45) Date of Patent: Dec. 9, 2025

(54) THREE-DIMENSIONAL MEMORY DEVICE AND METHOD FOR FABRICATING THE SAME

(71) Applicant: Fujian Jinhua Integrated Circuit Co., Ltd., Fujian (CN)

(72) Inventors: Guoguo Kong, Quanzhou (CN); Meng Qi Zhuang, Quanzhou (CN); Yun-Fan Chou, Quanzhou (CN); Yu-Cheng Tung, Quanzhou (CN); Shi-Wei He, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 529 days.

(21) Appl. No.: 17/978,229

(22) Filed: Nov. 1, 2022

(65) Prior Publication Data

US 2023/0309306 A1 Sep. 28, 2023

(30) Foreign Application Priority Data

Mar. 24, 2022 (CN) .......................... 202210303407.6
Mar. 24, 2022 (CN) .......................... 202220676402.3

(51) Int. Cl.
*H10B 43/27* (2023.01)
*H01L 23/528* (2006.01)
*H10B 43/10* (2023.01)

(52) U.S. Cl.
CPC ......... *H10B 43/27* (2023.02); *H01L 23/5283* (2013.01); *H10B 43/10* (2023.02)

(58) Field of Classification Search
CPC ...... H10B 43/27; H10B 43/10; H01L 23/5283
See application file for complete search history.

(56) References Cited

U.S. PATENT DOCUMENTS

| 11,107,765 | B2 | 8/2021 | Lee et al. | |
|---|---|---|---|---|
| 2012/0003831 | A1* | 1/2012 | Kang | H10B 41/50 257/E21.645 |
| 2019/0355738 | A1 | 11/2019 | Zhao | |
| 2023/0187351 | A1 | 6/2023 | Kong | |

* cited by examiner

*Primary Examiner* — Jay C Kim
*Assistant Examiner* — Woo K Lee
(74) *Attorney, Agent, or Firm* — Winston Hsu

(57) ABSTRACT

The present disclosure provides a three-dimensional memory device and a method of fabricating the same, which includes a substrate, and a memory stack structure. The memory stack structure is disposed on the substrate, and includes a plurality of stack units sequentially stacked into a staircase shape, wherein each of the stack units has a stepped slope, the stepped slope of any one of the stack units disposed in a related lower position is less than the stepped slope of another one of the stack units disposed over the one of the stack units. Through this arrangements, the three-dimensional memory device may therefore obtain an optimized structural integrity, as well as improved component efficiency.

11 Claims, 5 Drawing Sheets

THREE-DIMENSIONAL MEMORY DEVICE AND METHOD FOR FABRICATING THE SAME

BACKGROUND OF THE INVENTION

1. Field of the Invention

The present disclosure generally relates to a semiconductor device and a method of fabricating the same, and more particularly, to a three-dimensional memory device and a method of fabricating the same.

2. Description of the Prior Art

Memory devices are indispensable and important parts in modern electronic products. In addition to memorize the user's data, the memory devices are also responsible for memorizing the program code executed by the central processing unit and the information that needs to be temporarily saved during the operation. Semiconductor memory devices may be classified into volatile memory devices and non-volatile memory devices. Data stored in a volatile memory device such as a dynamic random access memory (DRAM) or a static random access memory (SRAM) is erased when the volatile memory device is out of power supply, and must be re-entered at the next power supply. Data stored in a non-volatile memory device such as a read-only memory (ROM) or a flash memory is still kept in the non-volatile memory device when the power is turned off, so that the data may be directly read after the power is supplied again.

NAND flash memory is the most widely used non-volatile memory with the advantages of small size, low power consumption, fast operation speed and low manufacturing cost. As the semiconductor manufacturing technology continues to progress, a three-dimensional (3D) NAND flash memory has been developed to obtain a higher cell density to meet the demand for a higher storage capacity. The three-dimensional NAND flash memory generally includes a staircase structure disposed at one side or plural sides of a memory stack structure, so as to fan-out each layer of wordlines for electrically connecting to an interconnection structure (such as a wordline contact). However, due to the number of the stacked layers of the memory stack structure has continuously increased, the related fabricating process, and the device structure have to be further improved to maintain a better device performance under a simplified process flow.

SUMMARY OF THE INVENTION

One of the objectives of the present disclosure provides three-dimensional memory device and a method of fabricating the same, which includes a plurality of stack units having an inclined sidewall, with the stack units being stacked on one over another to form a staircase structure of the 3D memory device. The slope of the inclined sidewall of each stack unit gradually increases with the stacking sequence from top to bottom, so that, the insulating layer with poor gap-filling capacity may cover on each stack unit in a more complete and uniform manner, thereby forming discontinuously covering film or broken film to expose the conductive layer. With these arrangements, the present disclosure may effectively improve the influence of the side etching effect of the conductive layer on the insulating layer which is disposed over the conductive layer, so as to improve the structural integrity of the insulating layer, to strengthen the protection of the insulating layer on each conductive layer, and to enhance the device performance of the three-dimensional memory device.

To achieve the purpose described above, one embodiment of the present disclosure provides a three-dimensional memory device including a substrate and a memory stack structure. The memory stack structure is disposed on the substrate and includes a plurality of stack units sequentially stacked into a staircase shape, wherein each of the stack units has a stepped slope, the stepped slope of any one of the stack units disposed in a related lower position is greater than the stepped slope of another one of the stack units disposed over the one of the stack units.

To achieve the purpose described above, one embodiment of the present disclosure provides a method of fabricating the three-dimensional memory device including the following steps. Firstly, a substrate is provided. Next, a memory stack structure is formed on the substrate. The memory stack structure includes a plurality of stack units sequentially stacked into a staircase shape, wherein each of the stack units has a stepped slope, the stepped slope of any one of the stack units disposed in a related lower position is greater than the stepped slope of another one of the stack units disposed over the one of the stack units.

These and other objectives of the present disclosure will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. These drawings and descriptions are used to illustrate the principles of the embodiments. It should be noted that all drawings are schematic, and the relative dimensions and scales have been adjusted for the convenience of drawing. Identical or similar features in different embodiments are marked with identical symbols.

FIG. 1 to FIG. 3 are schematic diagrams illustrating a three-dimensional memory device according to one embodiment in the present disclosure, wherein:

FIG. 1 shows a schematic top view of a three-dimensional memory device;

FIG. 2 shows a schematic cross-sectional view taken along a cross-line A-A' in FIG. 1; and FIG. 3 shows a partial enlarged view of FIG. 2.

FIG. 6 to FIG. 11 are schematic diagrams illustrating a method of fabricating a three-dimensional memory device according to one embodiment in the present disclosure, wherein:

FIG. 6 shows a schematic top view of a three-dimensional memory device after performing a first etching process;

FIG. 7 shows a schematic cross-sectional view taken along a cross-line A-A' in FIG. 6;

FIG. 8 shows a schematic top view of a three-dimensional memory device after performing a second etching process;

FIG. 9 shows a schematic cross-sectional view taken along a cross-line A-A' in FIG. 8;

FIG. 10 shows a schematic cross-sectional view of a three-dimensional memory device after performing a first etching process of a trim-etching process; and FIG. 11 shows a schematic cross-sectional view of a three-dimensional memory device after performing a second etching process of a trim-etching process.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
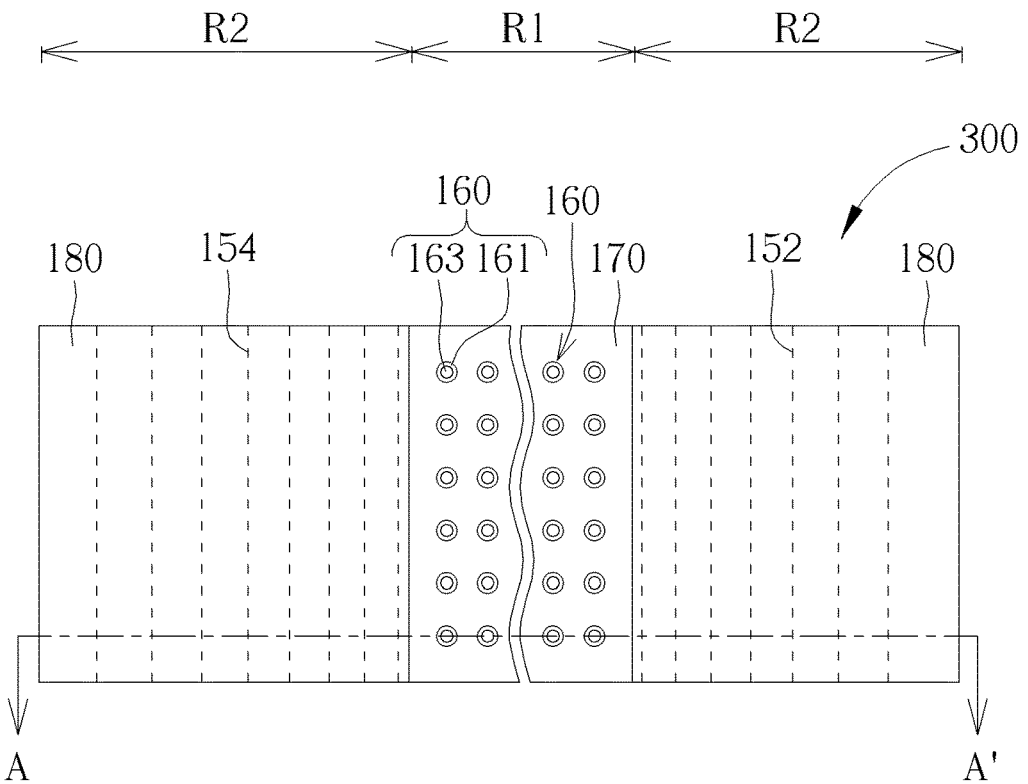
Figure 2:
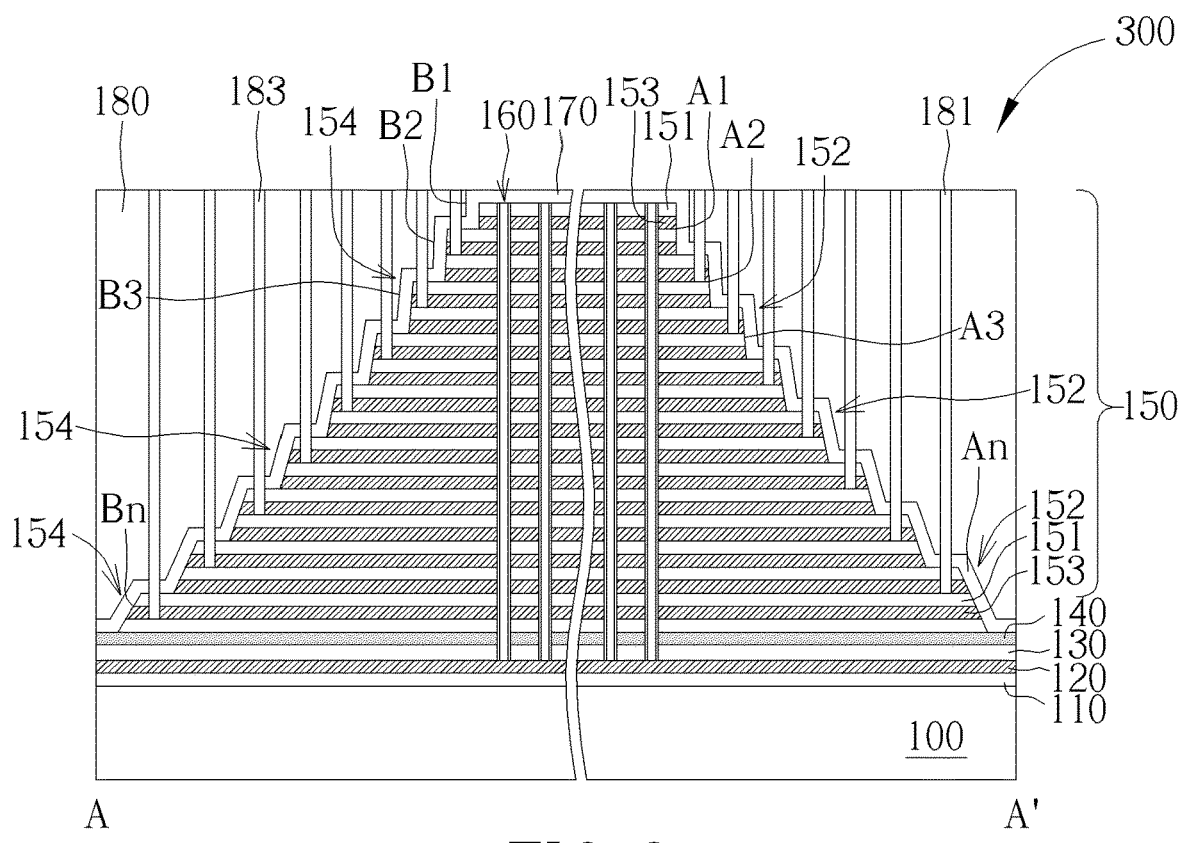
Figure 3:
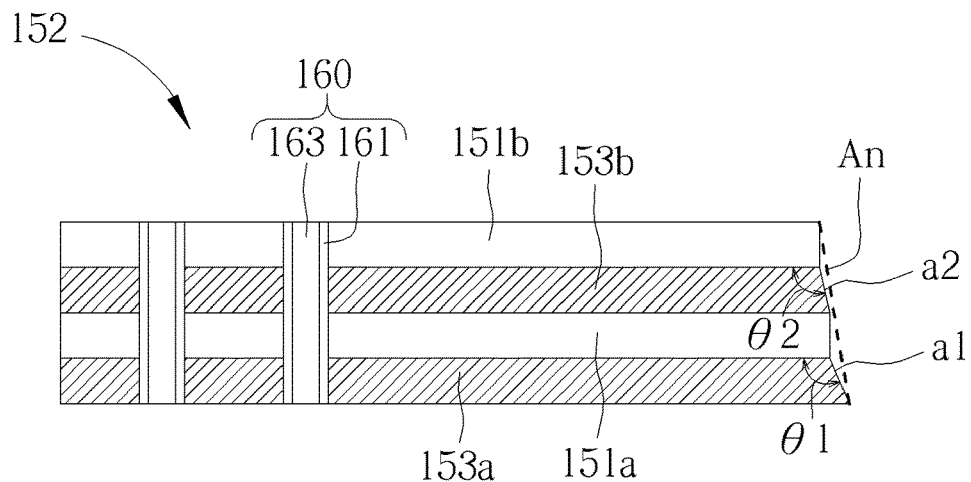

Please refer to FIG. 1 to FIG. 3, which are schematic diagrams of a three-dimensional (3D) memory device 300 according to one embodiment in the present disclosure, with FIG. 1 illustrating a top view of the 3D memory device 300, with FIG. 2 illustrating a cross-sectional view of the 3D memory device 300, and with FIG. 3 illustrating a partial enlarged view of the 3D memory device 300. Firstly, please refer to FIG. 1 and FIG. 2, the 3D memory device 300 includes a substrate 100, and a memory stack structure 150 disposed on the substrate 100. The substrate 100 for example includes a silicon substrate, a silicon containing substrate, an epitaxial silicon substrate, a silicon-on-insulator (SOI) substrate, or a substrate having other suitable materials. The 3D memory device further includes a pad layer 110, a conductive layer 120, and a dielectric layer 130, and an etching stop layer 140 stacked from bottom to top between the substrate 100 and the memory stack structure 150, as shown in FIG. 2, but not limited thereto. In one embodiment, the pad layer 110, the dielectric layer 130 for example includes a dielectric material such as silicon oxide ($SiO_x$), silicon nitride (SiN), silicon oxynitride (SiON), or a combination thereof, and preferably includes silicon oxide; the conductive layer 120 for example includes a conductive material such as aluminum (Al), titanium (Ti), tantalum (Ta), tungsten (W), niobium (Nb), molybdenum (Mo), copper (Cu), titanium nitride (TiN), titanium carbide (TiC), tantalum nitride (TaN), titanium tungsten (Ti/W), titanium and titanium nitride (Ti/TiN), polysilicon, doped silicon, silicide, other metal or non-metal conductive materials, or any combination thereof, and preferably includes tungsten; and the etching stop layer 140 for example includes a material having etching selectivity related to that of the conductive layer 120 and the dielectric layer 130, such as aluminum oxide ($Al_2O_3$), but is not limited thereto.

The substrate 100 further includes two regions defined thereon, such as a first region R1 and a second region R2, the first region R1 for example includes a memory array region, and the second region for example includes a wordline contact region. In one embodiment, the substrate 100 for example includes two second regions R2, disposed at two opposite sides of the first region R1, as shown in FIG. 1, but not limited thereto. People well skilled in the art should fully understand that the first region and the second region may further include other arrangements based on practical product requirements. For example, in another embodiment, the second region (not shown in the drawings) may also be optionally disposed outside the periphery of the first region so as to surround the first region. In addition, the 3D memory device 300 further includes a plurality of channel structures 160, disposed within the first region R1 of the substrate 100. In one embodiment, each of the channel structure 160 for example includes a pillar shape (such as a cylindrical shape) extended along a direction being perpendicular to the surface of the substrate 100 to penetrate the stack memory structure 150, the etching stop layer 140, the dielectric layer 130, the conductive layer 120, and the pad layer 110 sequentially, and directly contact the substrate 100. Precisely, each of the channel structures 160 further includes a functional layer 161 disposed on sidewalls of the openings (not shown in the drawings), and a filling layer 163 filled up the openings. In one embodiment, the function layer 161 for example includes a composite structure, for example, the composite structure includes an oxide-nitride-oxide (ONO) structure and the channel layer stacked sequentially on the sidewalls of the openings, wherein the channel layer for example includes a semiconductor material, such as polysilicon, and the filling layer 163 for example includes a dielectric layer, such as oxide, but not limited thereto.

On the other hand, the memory stack structure 150 includes a plurality of dielectric layers 151 and a plurality of conductive layers 153 alternately stacked along the direction, wherein each of the dielectric layer 151 for example includes the same dielectric material, such as silicon oxide, silicon nitride, silicon oxynitride, or a combination thereof, and preferably includes a dielectric material which is the same as that (oxide) of the dielectric layer 130, and each of the conductive layer 153 for example the same conductive material, such as aluminum, titanium, tantalum, tungsten, niobium, molybdenum, copper, and preferably includes a conductive material which is the same as that (titanium) of the conductive layer 120, but is not limited thereto. Furthermore, any one of the conductive layers 153 and the dielectric layer 151 disposed thereon are together regarded as a conductive-dielectric pair (not shown in the drawings), and each of the conductive-dielectric pairs extends from one second region R2 disposed at one side of the first region R1 to another second region R2 disposed at another side of the first region R1, to obtain the same or different extending areas with another one of the conductive-dielectric pairs adjacent thereto. In the present embodiment, the conductive-dielectric pairs having the same extending area may therefore present like a plurality of stack units 152, 154 respectively in the second area R2 disposed at two sides of the first region R1, wherein each of the stack units 152, 154 for example includes two sets of the conductive-dielectric pairs, which including a first conductive layer 153a, a first dielectric layer 151a, a second conductive layer 153b, and a second dielectric layer 151b stacked sequentially from bottom to top, as shown in FIG. 3, but not limited thereto. It is noted that, in the present embodiment, the extending area of any one of the stack units 152, 154 disposed at a related lower position is greater than the extending area of another one of the stack units 152, 154 disposed at a related upper position, and a top surface (namely, the top surface of the second dielectric layer 151b) of any one of the stack units 152, 154 disposed at a related lower position is partially exposed from the stack units 152, 154 disposed thereon. Through these arrangements, the stack units 152, 154 may therefore stack into a staircase shape structure respectively within the two second regions R2, with each of the stack units 152, 154 being configured as each step of the staircase shape structure, as shown in FIG. 2.

It is also noted that, in the present embodiment, the top surface of each of the stack units 152 arranged in an odd number order (counted from top to bottom) is partially exposed, namely exposing a partial surface of the second dielectric layer 151b in the odd-numbered set of the conductive-dielectric pairs, and the top surface of each of the stack units 154 arranged in an even number order (counted from top to bottom) is partially exposed, also exposing a partial surface of the second dielectric layer 151b in the even-number set of the conductive-dielectric pairs. In other words, each step stacked in the two staircase structures at two sides has a step difference with a set of the conductive-dielectric pair, as shown in FIG. 2, but is not limited thereto. Furthermore, in the present embodiment, each of the stack units 152, 154 has a sidewall inclined toward the second regions R2, with a stepped slope of each sidewall being gradually increased as the stacking order of the stacked units 152, 154 stacked from top to bottom. For example, the stack unit 152 disposed at the topmost order has a stepped slope "A1", other stack units 152 disposed therebelow have stepped slopes "A2", "A3", . . . "An", respectively, and the stepped slope "A2", the stepped slope "A3", or the stepped slope "An" is greater than the stepped slope "A1". Also, the stepped slope "An" is greater than the stepped slope "A3", and the stepped slope "A3" is greater than the stepped slope "A2". Likewise, the stack unit 154 disposed at the topmost order has a stepped slope "B1", other stack units 154 disposed therebelow have stepped slopes "B2", "B3", . . . "Bn", respectively, and the stepped slope "B2", the stepped slope "B3", or the stepped slope "Bn" is greater than the stepped slope "B1". Also, the stepped slope "Bn" is greater than the stepped slope "B3", and the stepped slope "B3" is greater than the stepped slope "B2", as shown in FIG. 2.

Figure 4:
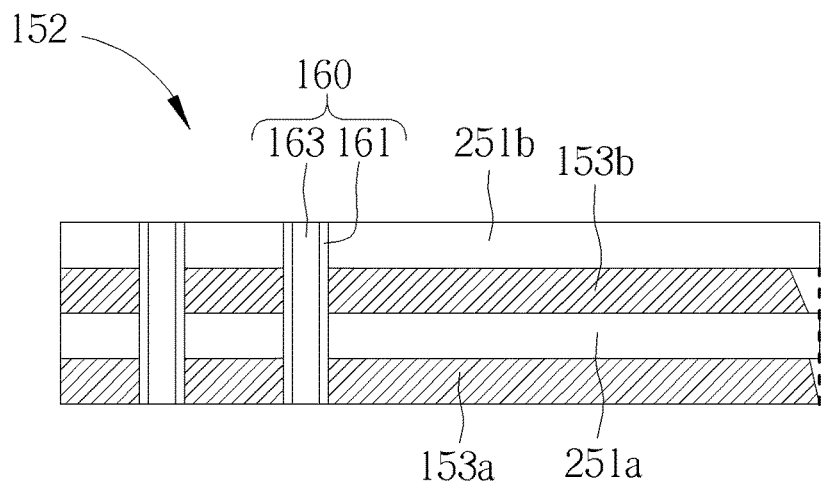
FIG. 4 is a schematic diagram illustrating an enlarged view of a three-dimensional memory device according to another embodiment in the present disclosure.
Figure 5:
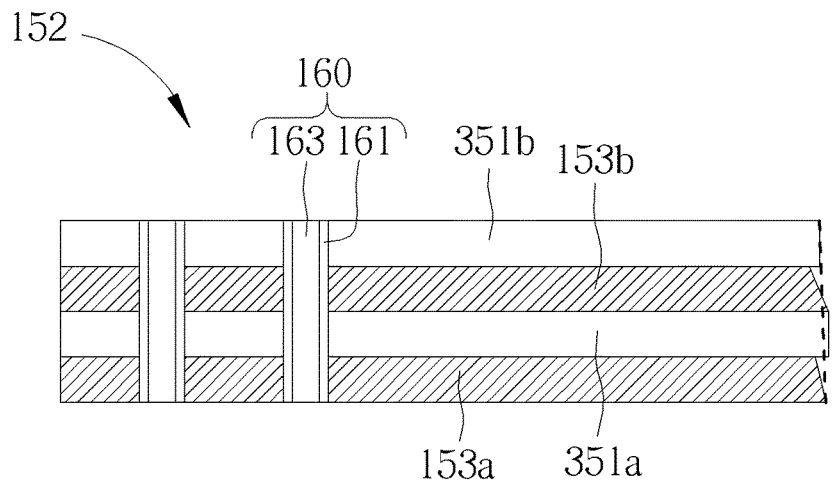
FIG. 5 is a schematic diagram illustrating an enlarged view of a three-dimensional memory device according to another embodiment in the present disclosure.

It is noteworthy that the stepped slope of the present embodiment is actually a defined value. Specifically, as shown in FIG. 3, the second conductive layer 153b and the first conductive layer 153b of each stack unit 152, 154 are affected by the etching processes which are performed in the fabrication, thereby forming inclined sidewalls with different slopes. However, within the same stack unit 152, the second conductive layer 153b stacked upper and the first conductive layer 153b stacked lower may respectively have a slope "a2", and a slope a1 which are different from each other, because of being suffered from various influences of the etching process. The slope "a2" is less than the slope "a1", and then, the stepped slope "An" of the stack unit 152 is namely the average value of the slope "a1", and the slope "a2", but is not limited thereto. That is, the sidewall of the second conductive layer 153b has a second included angle "θ2" with respect to the bottom surface of the second dielectric layer 151b, the sidewall of the first conductive layer 153a has a first included angle "θ1" with respect to the bottom surface of the first dielectric layer 151a, and the second included angle "θ2" is less than the first included angle "θ1". On the other hand, the first dielectric layer 151a and the second dielectric layer 151b are not affected by the etching process, and which may have sidewalls being perpendicular to the surface of the substrate 100. However, according to various etching selectivity of the etching process, the first dielectric layer 151a and the second dielectric layer 151b may be optionally not overlapped with the sidewalls of the first conductive layer 153a and the second conductive layer 153b in a direction being perpendicular to the surface of the substrate 100. Then, the sidewalls of the first conductive layer 153a and the second conductive layer 153b may be exposed from the first dielectric layer 151a and the second dielectric layer 151b respectively, as shown in FIG. 3, but not limited thereto. In another embodiment, a first dielectric layer 251a and a second dielectric layer 251b may also be completely overlapped with the sidewalls of the first conductive layer 153a and the second conductive layer 153b in the direction being perpendicular to the surface of the substrate 100, so that, the sidewalls of the first conductive layer 153a and the second conductive layer 153b may be completely covered by the first dielectric layer 251a, and the second dielectric layer 251b, as shown in FIG. 4. Otherwise, in another embodiment, a first dielectric layer 351a and a second dielectric layer 351b may also be partially overlapped with the sidewalls of the first conductive layer 153a, and the second conductive layer 153b, so that, the sidewalls of the first conductive layer 153a, and the second conductive layer 153b may be partially covered by the first dielectric layer 351a, and the second dielectric layer 351b, as shown in FIG. 5.

Then, as shown in FIG. 1 to FIG. 3, the 3D memory device 300 further includes an insulating layer 170 and an interlayer dielectric layer 180 sequentially disposed on the substrate 100, and a plurality of wordline contacts 181, 183, wherein the wordline contacts 181, 183 are penetrated through the interlayer dielectric layer 180, the insulating layer 170, and the second dielectric layer 151b of each stack unit 152, 154 to directly in contact with the second conductive layer 153b of each stack unit 152, 154, respectively. Precisely speaking, the insulating layer 170 is conformally covered on the memory stack structure 150, between the memory stack structure 150 and the interlayer dielectric layer 180, to directly in contact with the sidewall of each stack unit 152, 154 (namely, the sidewalls of the first conductive layer 153a, the first dielectric layer 151a, the second conductive layer 153b, and the second dielectric layer 151b), and the interlayer dielectric layer 180 is entirely covered on the substrate 100 and the memory stack structure 150, to obtain a coplanar top surface with the insulating layer 170 covered on the top surface of the memory stack structure 150, as shown in FIG. 2. In one embodiment, the insulating layer 170 and the interlayer dielectric layer 180 may respectively include a dielectric material, such as silicon oxide, silicon nitride, silicon oxynitride, or a combination thereof. Preferably, the insulating layer 170 for example includes a dielectric material having a relative higher density and poor gap-filling ability, such as silicon nitride, so as to increase the protection on each conductive layer 153. The interlayer dielectric layer 180 for example includes a dielectric material which is different from that of the insulating layer 170, such as silicon oxide, but is not limited thereto. The wordline contacts 181, 183 may include a conductive material, such as aluminum, titanium, tantalum, tungsten, niobium, molybdenum, copper, or the like, and preferably includes tungsten, but is not limited thereto.

Through these arrangements, the 3D memory device 300 of the present embodiment may intersect with each conductive layer 153 in the memory stack structure 150 through the channel structures 160, wherein the intersection between each channel structure 160 and each conductive layer 153 may become each memory cell of the 3D memory device 300, with each conductive layer 153 being functioned as a wordline for electrically connecting each wordline contact 181, 183 to controlling the writing and reading of data in each memory cell. Since the memory stack structure 150 of the present embodiment 150 includes a plurality of stack units 152, 154 having inclined sidewalls respectively to stack into a staircase structure, so that, the top surface of each conductive-dielectric pair (including any layer of the conductive layers 153 and the dielectric layer 151 disposed above) arranged in the odd number order (counted from top to bottom) is partially exposed, and the top surface of each conductive-dielectric pair arranged in an even number order (counted from top to bottom) is also partially exposed, so as to facilitate the electrically connection between the conductive layers 153 of each conductive-dielectric pair and the wordline contacts 181, 183. On the other hand, the stepped slopes of the sidewalls of the stack units 152, 154 are gradually increased with the stack order from top to bottom, so that, the stack unit 152/154 arranged at the topmost position may obtain a relative smaller stepped slope "A1"/"B1", and the stack units 152/154 arranged therebelow may obtain relative greater stepped slopes "A2", "A3", . . . "An"/"B1", "B2", . . . "Bn". In this way, the insulating layer 170 with a poor gap-filling agility may enable to be entirely and completely covered on the memory stack structure 150, thereby avoiding the formation of discontinuous covering films or broken films to expose the conductive layers 153 or dielectric layers 151, especially the conductive layers 153 or dielectric layers 151 of the stack units 152/154 arranged at a relative lower position. With such arrangements, the protection of the insulating layer 170 may be sufficiently enhanced, and the 3D memory device 300 of the present embodiment may therefore obtain an optimized structural integrity, as well as improved component efficiency.

In order to enable the people well-skilled in the art to realize the 3D memory device 300 according to the aforementioned embodiment of the present disclosure, the fabricating method of the 3D memory device 300 will be further described in detail below.

Figure 6:
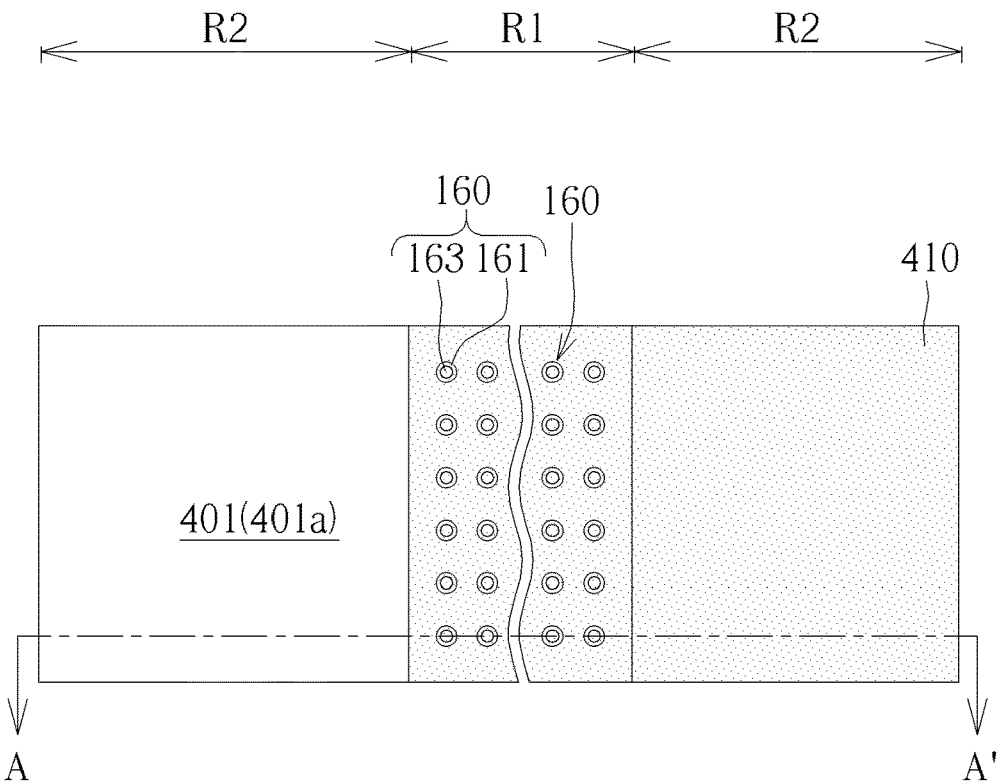
Figure 7:
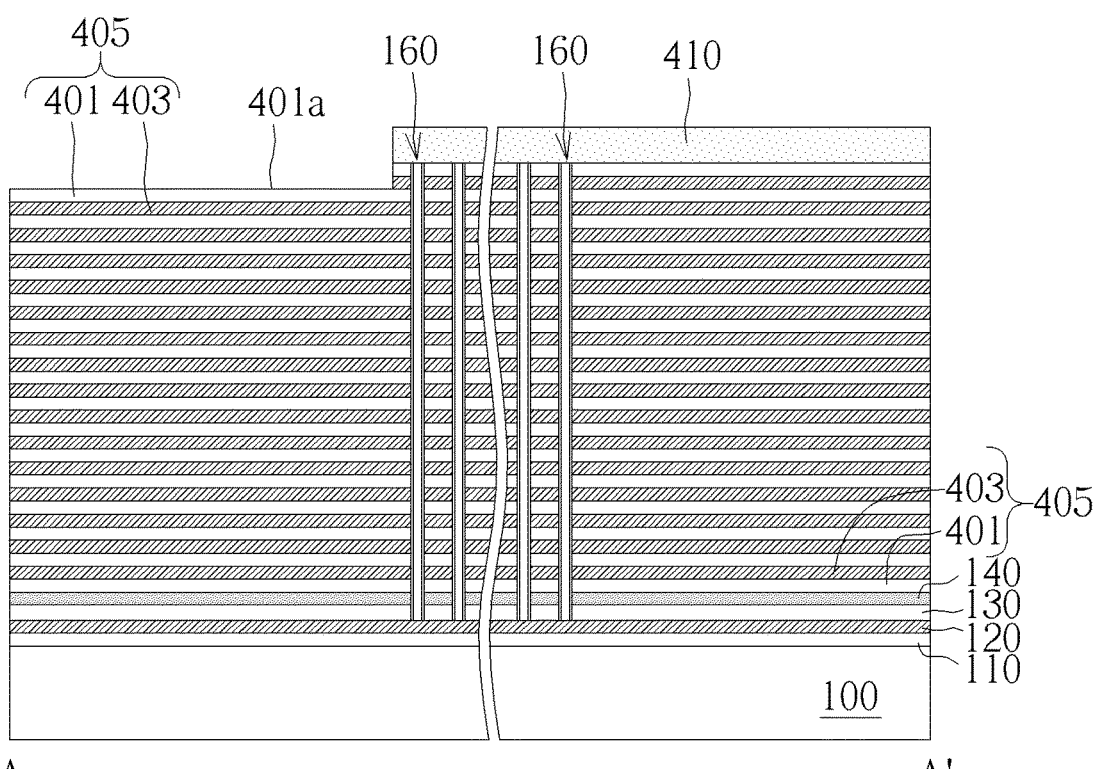

Please refer to FIG. 6 to FIG. 11, which are schematic diagrams illustrating a method of fabricating a 3D memory device according to one embodiment in the present disclosure. Firstly, as shown in FIG. 6 and FIG. 7, the substrate 100 is provided, and the liner layer 110, the conductive layer 120, the dielectric layer 130, and the etching stop layer 140 are sequentially formed on the substrate 100. Also, a plurality of dielectric material layers 401 and a plurality of conductive material layers 403 are alternately stacked on the etching stop layer 140, wherein, each of the dielectric material layers 401 includes for example the same dielectric material such as silicon oxide, silicon nitride, silicon oxynitride or a combination thereof, and preferably includes silicon oxide, and each of the conductive material layers 403 includes for example the same conductive material such as aluminum, titanium, tantalum, tungsten, niobium, molybdenum, copper, and preferably includes tungsten, but not limited thereto. Among them, any one of the conductive material layers 403 and the dielectric material layer 401 above it may together present as a set of conductive-dielectric layer pairs 405, and each set of the conductive-dielectric layer pairs 405 may extend from one second region R2 disposed at a side of the first region R1 (namely, the right side as shown in FIG. 6 and FIG. 7) to another second region R2 disposed at another side of the first region R1 (namely, the left side as shown in FIG. 6 and FIG. 7), in a direction being parallel to the surface of the substrate 100. Next, a plurality of channel structures 160 is formed in the first region R1, to sequentially penetrate through each set of the conductive-dielectric layer pairs 405, the etching stop layer 140, and the dielectric layer 130, to directly in contact with the conductive layer 120, as shown in FIG. 6 and FIG. 7.

After that, a first mask layer (for example including a photoresist material) 410 is formed on the substrate 100, to cover the conductive material layers 403 and the dielectric material layers 401 stacked alternately, wherein the first mask layer 410 entirely covers the substrate 100 within the first region R1 and the second region R2 at one side of the first region R1 (namely, the right side as shown in FIG. 6 and FIG. 7), and partially covers the substrate 100 within another second region R2 at another side of the first region R1 (namely, the left side as shown in FIG. 6 and FIG. 7), to expose the dielectric material layers 401 disposed within the another second region R2. Next, a first etching process, such as a dry etching process or a wet etching process, is performed through the first mask layer 410, to remove an exposed set of the conductive-dielectric layer pairs 405 (including the dielectric material layer 401 and the conductive material layer 403), within the another second region R2, thereby forming a relative lower top surface 401a in the another second region R2 to function like the stack unit mentioned in the previous embodiments. Then, the first mask layer 410 is completely removed.

Figure 8:
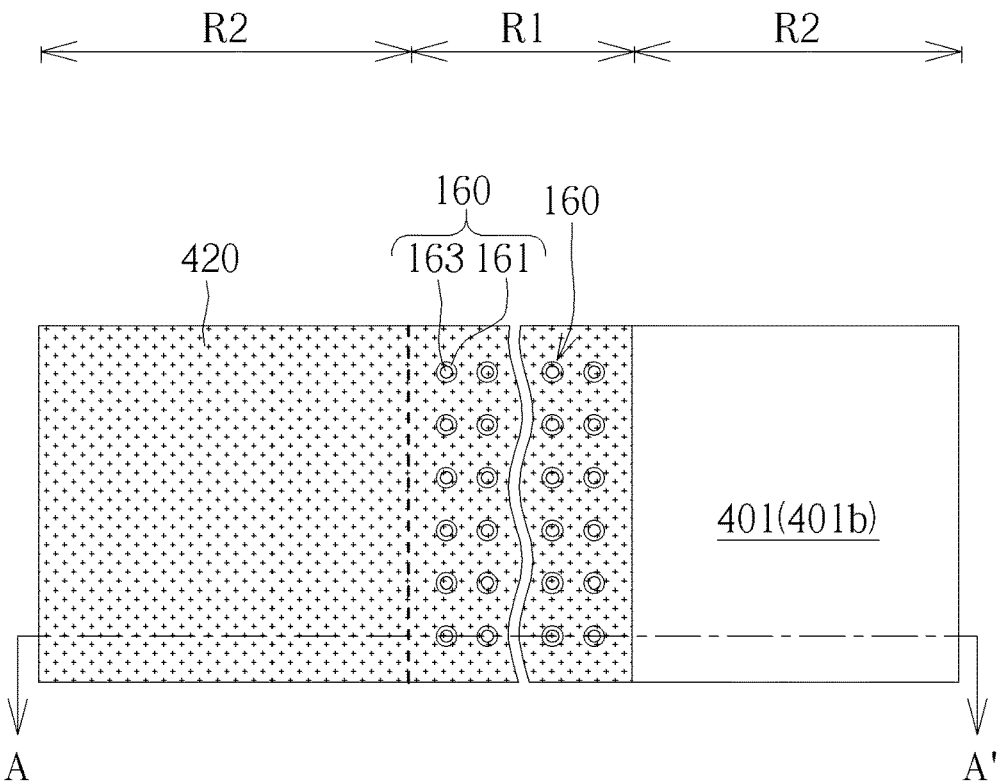
Figure 9:
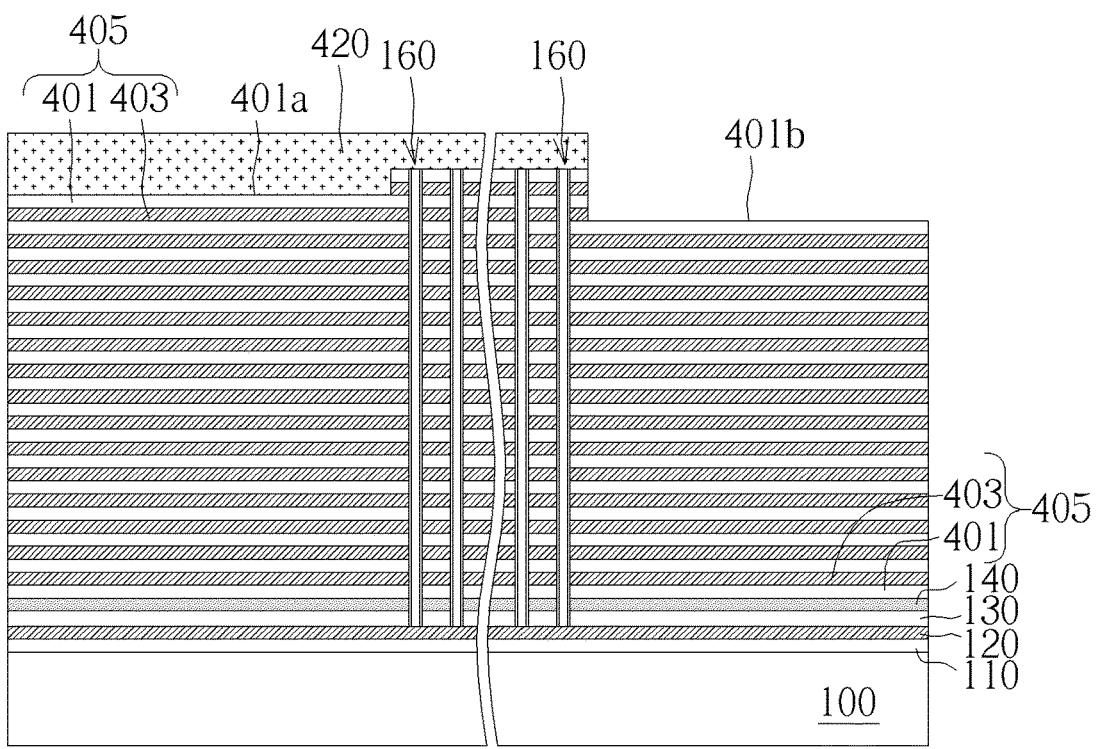

Next, please refer to FIG. 8 and FIG. 9, a second mask layer (for example including a photoresist material) 420 is formed on the substrate 100 to entirely cover the substrate 100 within the first region R1 and the second region R2 at the another side of the first region R1), and to partially cover the substrate 100 within another second region R2 at the side of the first region R1, to expose the dielectric material layers 401 disposed within the second region R2. Next, a second etching process, such as a dry etching process or a wet etching process, is performed through the second mask layer 420, to remove two exposed set of the conductive-dielectric layer pairs 405 within the second region R2, thereby forming a relative lower top surface 401b in the second region R2 as shown in FIG. 8 and FIG. 8. Then, the second mask layer 420 is completely removed. Accordingly, there is a step difference of a set of the conductive-dielectric layer pairs 405 between the top surface 401b in the second region R2 and the top surface 401a in the another second region R2, but it is not limited to.

Figure 10:
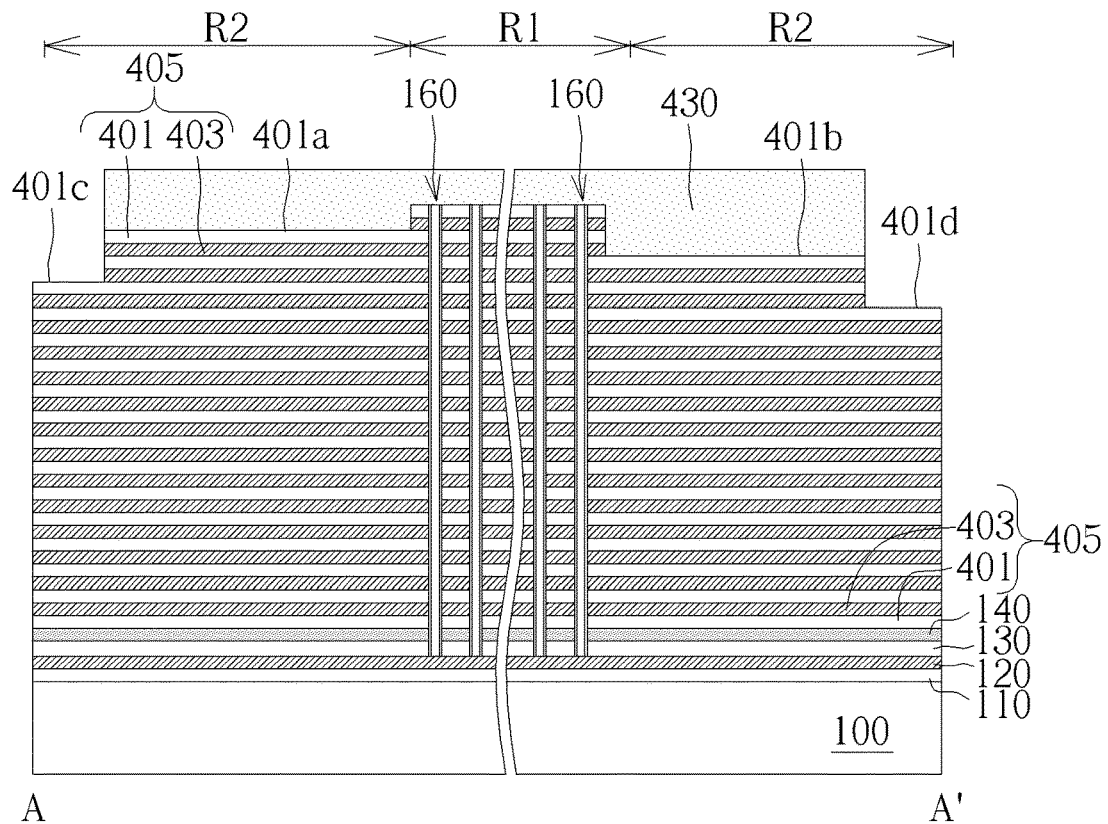

Please refer to FIG. 10, a trim-etching process is performed. Firstly, a third mask layer (for example including a photoresist material) 430 is formed on the substrate 100, to entirely cover the substrate 100 within the first region R1, and to partially cover the two second regions R2 at two sides of the first region R1, thereby exposing a portion of the top surfaces 401a, 401b. Then, a first etching is performed through the third mask layer 430, and the dielectric material layer 401 and the conductive material layer 403 are then etched downwardly through the exposed portions of the top surfaces 401a, 401b, respectively, till removing two sets of the conductive-dielectric layer pairs 405 to form relative lower surfaces 401c, 401d, which may also function like the stack units as mentioned in the previous embodiments. It is noted that, there is also a stepped difference of a set of conductive-dielectric layer pairs 405 between the top surface 401d at the second region R2 and the top surface 401c at the another second region R2, as shown in FIG. 10.

Figure 11:
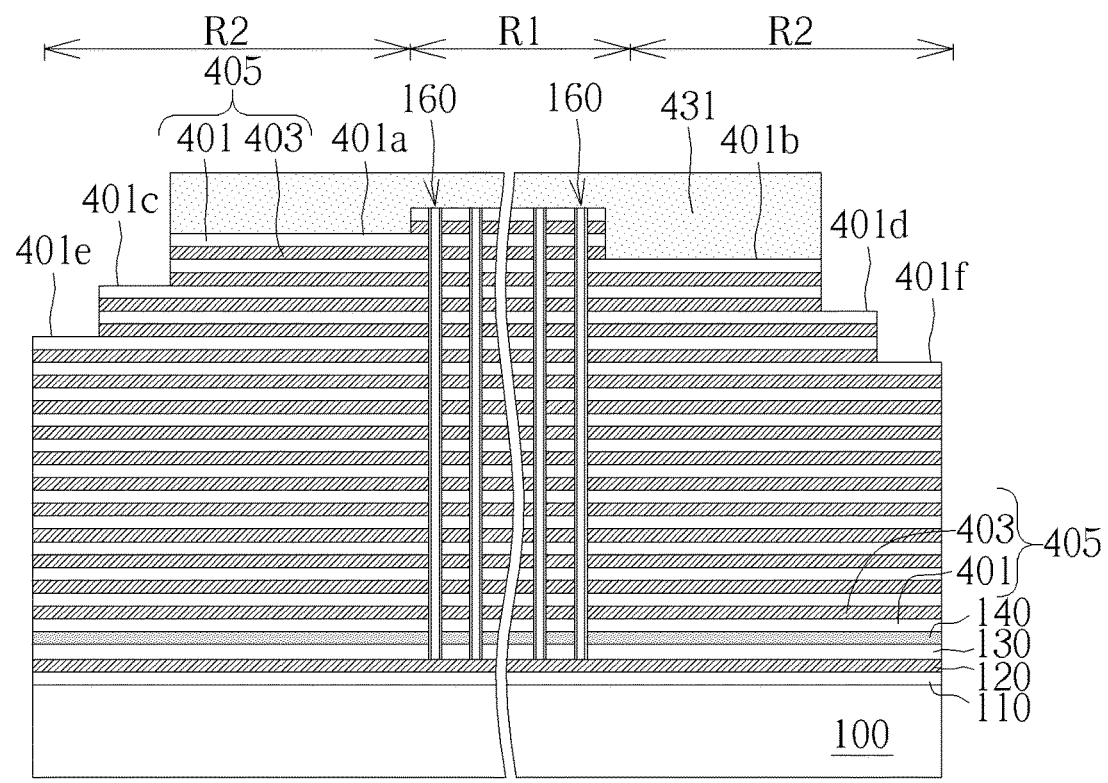

Next, a trim step of the third mask layer 430 and an etching step of the conductive-dielectric layer pairs 405 are repeatedly performed, which includes but is not limited to be the following processes. Firstly, as shown in FIG. 11, the third mask layer 430 is trimmed to form a third mask layer 431, for further exposing another portion of the top surfaces 401a, 401b. Next, a second etching is performed through the third mask layer 431, and the dielectric material layer 401 and the conductive material layer 403 are then etched downwardly through the another portions of the top surfaces 401a, 401b, respectively, till further removing another two sets of the conductive-dielectric layer pairs 405 to form relative lower surfaces 401e, 401g. Then, by repeating the trim step and the etching step, the memory stack structure 150 as shown in FIG. 1 and FIG. 2 may be formed. After that, the insulating layer 170, the interlayer dielectric layer 180, and the wordline contacts 181, 183 are sequentially formed, wherein the wordline contacts 181, 183 are penetrated through the interlayer dielectric layer 180, the insulating layer 170, and the second dielectric layer 151b of each stack unit 152, 154 to directly in contact with the second conductive layer 153b of each stack unit 152, 154, respectively.

It is noteworthy that, among the fabricating method of the present embodiment, the first etching process and the second etching process are firstly performed before the trim-etching process, to partially remove the conductive-dielectric layer pairs 405 exposed from the second region R2 at one side of the first region R1, and the conductive-dielectric layer pairs 405 exposed from the another second region R2 at another side of the first region R1, thereby previously forming the step different between the two second regions R2. In this way, through any etching in the trimming-etching process, steps with a stepped difference of one set of the conductive-dielectric layer pairs 405 may be respectively formed in the two second regions R2, but it is not limited to. With such performances, the fabricating method of the present embodiment enables to achieve the purpose of fanning out each conductor layer 153 through relative few trimming-etching cycles, which may not only shorten the fabrication time, but also reduce the original thickness of the third mask layer 430 used in the trimming-etching process. Thus, the 3D memory device 300 with more complete structure and better performance may therefore be fabricated under a simplified process flow.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A three-dimensional memory device, comprising:
   a substrate; and
   a memory stack structure, disposed on the substrate, the memory stack structure comprising a plurality of stack units sequentially stacked into a staircase shape, wherein each of the stack units has a stepped slope, the stepped slope of any one of the stack units disposed in a related lower position is greater than the stepped slope of another one of the stack units disposed over the one of the stack units, wherein each of the stack units comprises a first conductive layer, a first dielectric layer, a second conductive layer, and a second dielectric layer stacked from bottom to top in a direction being perpendicular to the substrate, and the second conductive layer completely overlays a top surface of the first dielectric layer, and partially underlays a bottom surface of the second dielectric layer to expose a portion of the bottom surface of the second dielectric layer.

2. The three-dimensional memory device according to claim 1, wherein a sidewall of the first conductive layer comprises a first slope, a sidewall of the second conductive layer comprises a second slope, and the stepped slope of each stack unit is an average of the first slope and the second slope.

3. The three-dimensional memory device according to claim 2, wherein the second slope is greater than the first slope.

4. The three-dimensional memory device according to claim 2, wherein the sidewall of the first conductive layer has a first included angle relative to a bottom surface of the first dielectric layer, the sidewall of the second conductive layer has a second included angle relative to a bottom surface of the second dielectric layer, and the second included angle is smaller than the first included angle.

5. The three-dimensional memory device according to claim 2, wherein the first conductive layer and the second conductive layer comprises the same conductive material, and the first dielectric layer and the second dielectric layer comprises the same dielectric material.

6. The three-dimensional memory device according to claim 2, wherein the first dielectric layer does not overlap with the sidewall of the first conductive layer in a direction being perpendicular to the substrate, and the second dielectric layer does not overlap the sidewall of the second conductive layer in the direction.

7. The three-dimensional memory device according to claim 2, the first dielectric layer partially overlaps the sidewall of the first conductive layer in the direction, and the second dielectric layer partially overlaps the sidewall of the second conductive layer in the direction.

8. The three-dimensional memory device according to claim 2, the first dielectric layer completely overlaps the sidewall of the first conductive layer in a direction being perpendicular to the substrate, and the second dielectric layer completely overlaps the sidewall of the second conductive layer in the direction.

9. The three-dimensional memory device according to claim 2, further comprising:
   an interlayer dielectric layer, covering on the memory stack structure; and
   a plurality of wordline contacts, extended through the interlayer dielectric layer, and directly in contact with the second conductive layer of each of the stack units, respectively.

10. The three-dimensional memory device according to claim 9, further comprising:
    an insulating layer, disposed between the memory stack structure and the interlayer dielectric layer, the insulating layer directly in contact with the sidewalls of the first conductive layer, a sidewall of the first dielectric layer, the sidewall of the second conductive layer, and a sidewall of the second dielectric layer of each stack unit.

11. The three-dimensional memory device according to claim 1, further comprising a plurality of channel structures disposed in the memory stack structure to extend through the memory stack structure.

* * * * *